United States Patent
Mitomo et al.

(10) Patent No.: US 8,190,117 B2
(45) Date of Patent: May 29, 2012

(54) MIXER CIRCUIT AND RADIO COMMUNICATION DEVICE USING THE SAME

(75) Inventors: Toshiya Mitomo, Yokohama (JP); Osamu Watanabe, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 809 days.

(21) Appl. No.: 12/207,785

(22) Filed: Sep. 10, 2008

(65) Prior Publication Data

US 2009/0075619 A1   Mar. 19, 2009

(30) Foreign Application Priority Data

Sep. 14, 2007   (JP) .................................. 2007-239768

(51) Int. Cl.
*H04B 1/26* (2006.01)
*H04B 1/28* (2006.01)
*H01Q 11/12* (2006.01)

(52) U.S. Cl. ...................... 455/326; 455/333; 455/118

(58) Field of Classification Search .................. 455/296, 455/323, 326, 330, 333, 313, 324, 118, 327, 455/317, 318, 319, 119

See application file for complete search history.

(56) References Cited

U.S. PATENT DOCUMENTS

| | | | |
|---|---|---|---|
| 5,805,987 A * | 9/1998 | Kamase ........................ | 455/326 |
| 6,748,204 B1 | 6/2004 | Razavi et al. | |
| 7,184,739 B2 * | 2/2007 | Igarashi et al. ................ | 455/313 |
| 7,375,577 B2 * | 5/2008 | Lin ................................ | 327/356 |
| 7,558,556 B1 * | 7/2009 | Moloudi et al. ............... | 455/323 |
| 7,769,361 B2 * | 8/2010 | Zhuo et al. ..................... | 455/324 |
| 2003/0228858 A1 * | 12/2003 | Zhang et al. ................... | 455/323 |
| 2005/0170806 A1 * | 8/2005 | Kim ............................... | 455/323 |
| 2006/0068746 A1 * | 3/2006 | Feng et al. ..................... | 455/323 |
| 2007/0058747 A1 * | 3/2007 | Afsahi et al. .................. | 375/273 |
| 2007/0200622 A1 * | 8/2007 | Filoramo et al. ............... | 330/10 |
| 2007/0232241 A1 * | 10/2007 | Carley et al. ................... | 455/83 |
| 2008/0248775 A1 * | 10/2008 | Tsai et al. ...................... | 455/326 |

OTHER PUBLICATIONS

Razavi et al., A 60-GHz CMOS Receiver Front-End, IEEE Journal of Solid-State Circuits, vol. 41, Issue 1, pp. 17-22, 2006.

* cited by examiner

*Primary Examiner* — Andrew Wendell
*Assistant Examiner* — Cindy Trandai
(74) *Attorney, Agent, or Firm* — Turocy & Watson, LLP (57) ABSTRACT

A mixer circuit includes a voltage-to-current converter which converts a positive phase input voltage signal and a reversed phase input voltage signal input to a first input terminal and a second input terminal into a positive phase current signal and a reversed phase current signal, a switching circuit switches over the positive phase current signal and the reversed phase current signal according to a positive phase local signal and a reversed phase local signal, and generates a positive phase output current signal and a reversed phase output current signal, and an impedance element connected between the first common terminal and the second common terminal, having a relatively high impedance to a differential-mode signal between the positive phase current signal and the reversed phase current signal, and having a relatively low impedance to a common-mode signal between the positive phase current signal and the reversed phase current signal.

20 Claims, 5 Drawing Sheets

MIXER CIRCUIT AND RADIO COMMUNICATION DEVICE USING THE SAME

CROSS-REFERENCE TO RELATED APPLICATIONS

This application is based upon and claims the benefit of priority from prior Japanese Patent Application No. 2007-239768, filed Sep. 14, 2007, the entire contents of which are incorporated herein by reference.

BACKGROUND OF THE INVENTION

1. Field of the Invention

The present invention relates to a mixer circuit used in frequency conversion, quadrature modulation, quadrature demodulation and the like and a radio communication device using the mixer circuit.

2. Description of the Related Art

There is known a balanced mixer as one of mixer circuits used in a frequency converter or the like. U.S. Pat. No. 6,748,204 discloses a balanced mixer configured so that an impedance element, which causes a low-frequency signal current to pass through but hardly causes a signal current at a frequency near a high-frequency input signal frequency to pass through, is connected to common source terminals of a switching stage.

Further, Behzad Razavi, "A 60-GHz CMOS Receiver Front-End," IEEE Journal of Solid-State Circuits, Volume 41, Issue 1, pp. 17-22 discloses a balanced mixer configured so that an input transistor is connected to common source terminals of a switching stage, one end of an inductor corresponding to the impedance element is connected to the common source terminals, and the other end of the inductor is connected to a capacitor and a current source. A value of the inductor is selected so that a parasitic capacitance between the common source terminals and a ground and the inductor make a parallel resonant circuit.

In this way, if the inductor and the parasitic capacitance make the parallel resonance, a high-frequency current signal generated in the input transistor hardly diverges to the parasitic capacitance but is input to the switching stage. Therefore, the mixer circuit can acquire high gain. Moreover, since the current source connected to the other end of the inductor limits the current carried across the switching stage, thermal noise and flicker noise generated in transistors of the switching stage are reduced. Besides, the balanced mixer can operate at a low power supply voltage by reducing voltage drop resultant from load resistance.

If a double balanced mixer operable for differential input signals is to be realized using the circuit disclosed in U.S. Pat. No. 6,748,204, it suffices to double an input-stage circuit and the switching stage. However, the prior art circuit includes two problems, one being even order distortion and DC offset which occur from the mixer circuit itself, and the other being DC offset, noise and degradation of distortion characteristic, which occur when the common mode signal leaked from outside is input to the circuit.

BRIEF SUMMARY OF THE INVENTION

According to one aspect of the present invention, there is provide a mixer circuit comprising: a voltage-current converter which converts a positive phase input voltage signal and a reversed phase input voltage signal input to a first input terminal and a second input terminal into a positive phase current signal and a reversed phase current signal, respectively; a switching circuit which includes a first common terminal and a second common terminal receiving the positive phase current signal and the reversed phase current signal and a first local terminal and a second local terminal receiving a positive phase local signal and a reversed phase local signal, respectively, switches over the positive phase current signal and the reversed phase current signal according to the positive phase local signal and the reversed phase local signal, and generates a positive phase output current signal and a reversed phase output current signal; and an impedance element connected between the first common terminal and the second common terminal, having a relatively high impedance to a differential-mode signal between the positive phase current signal and the reversed phase current signal, and having a relatively low impedance to a common-mode signal between the positive phase current signal and the reversed phase current signal.

DETAILED DESCRIPTION OF THE INVENTION

Embodiments of the invention will be described below with reference to the drawings.

First Embodiment

Figure 1:
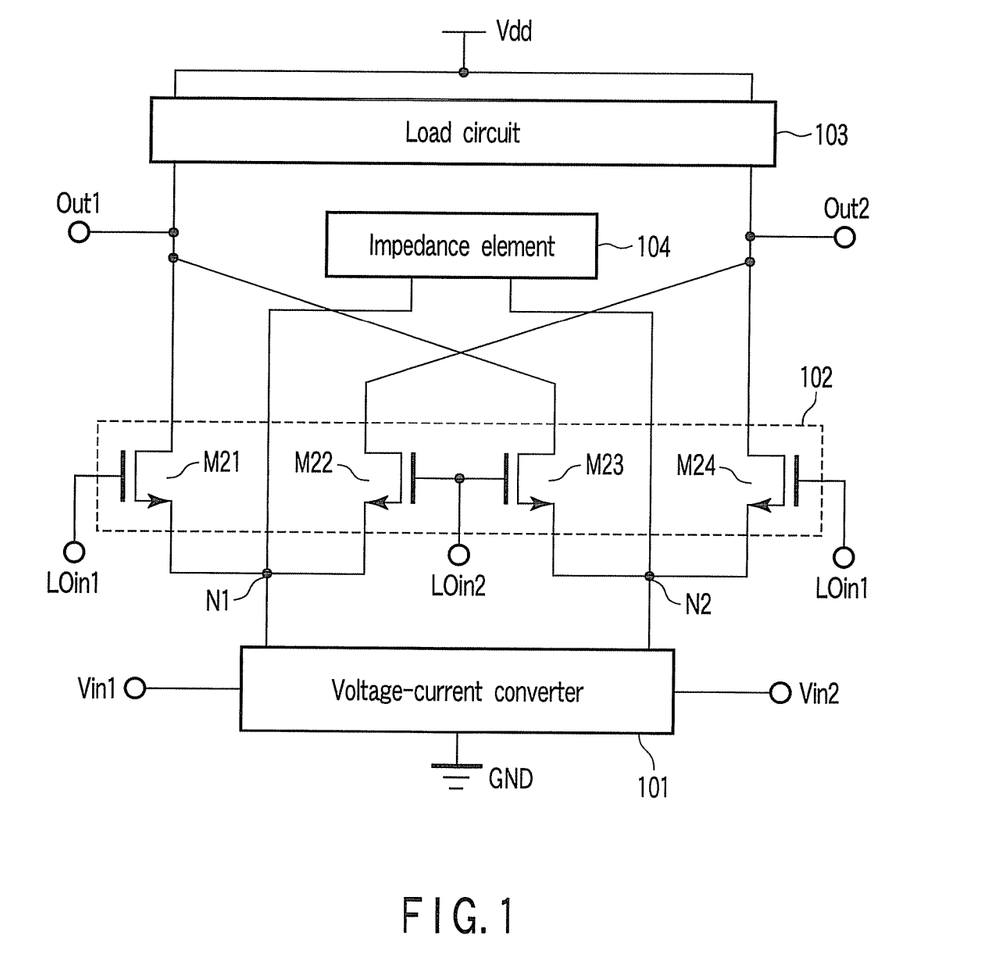
FIG. 1 is a circuit diagram showing a mixer circuit according to a first embodiment of the present invention.

FIG. 1 shows a double balanced mixer circuit according to a first embodiment of the present invention. The first embodiment is a basic embodiment of the present invention. In the mixer circuit shown in FIG. 1, high-frequency differential input voltage signals, that is, a positive phase input voltage signal and a reversed phase input voltage signal input to first and second input terminals Vin1 and Vin2 are multiplied by differential local signals, that is, a positive phase local signal and a reversed phase local signal input to first and second local terminals LOin1 and LOin2, respectively. A positive phase output signal and a reversed phase output signal corresponding to the results of the multiplication are output from first and second output terminals Out1 and Out2, respectively.

The positive phase input voltage signal and reversed phase input voltage signal from the input terminals Vin1 and Vin2 are converted into differential current signals, that is, a positive phase current signal and a reversed phase current signal by a voltage-to-current converter 101 of an input stage, respectively. The positive phase current signal and the reversed phase current signal from the voltage-to-current converter 101 are applied to two common terminals N1 and N2 of a switching circuit 102, respectively.

The switching circuit 102 includes two differential pairs including MOS transistors M21 and M22, and MOS transistors M23 and M24, respectively. A common source terminal to transistors M21 and M22 and a common source terminal to transistors M23 and M24 are connected to the common terminals N1 and N2, respectively. Gate terminals of transistors M21 and M24 are connected to the first local terminal LOin1 and gate terminals of transistors M22 and M23 are connected to the second local terminal LOin2. Drain terminals of transistors M21 and M23 are connected to a load circuit 103 and to the first output terminal Out1. Drain terminals of transistors M22 and M24 are connected to the load circuit 103 and to the second output terminal Out2.

In the switching circuit 102, the positive phase current signal and the reversed phase current signal from the voltage-to-current converter 101 are switched over according to the positive phase local signal and the reversed phase local signal from the local terminals LOin1 and LOin2, thereby generating differential output current signals, that is, a positive phase output current signal and a reversed phase output current signal. The generated positive phase output current signal and reversed phase output current signal are converted into voltage signals by the load circuit 103 or output from the first and second output terminals Out1 and Out2 as differential output signals, that is, a positive phase output signal and a reversed phase output signal as they are. While FIG. 1 shows that the switching circuit 102 is realized by the MOS transistors M21 to M24, the switching circuit 102 may be realized by bipolar transistors or other elements.

An impedance element 104 is connected between the common terminals N1 and N2 of the switching circuit 102. From viewpoints of the terminals N1 and N2, the impedance element 104 has a high impedance with respect to the differential-mode current signals and has quite a low impedance with respect to the common-mode current signal. Namely, the impedance element 104 has a relatively high impedance to a differential-mode signal between the positive phase current signal and the reversed phase current signal applied from the voltage-to-current converter 101, and has a relatively low impedance to a common-mode signal between the positive phase current signal and the reversed phase current signal. Such a function of the impedance element 104 can reduce deterioration in characteristics of the mixer circuit due to the input of the common-mode signal generated in the voltage-to-current converter 101.

A basic operation performed by the mixer circuit shown in FIG. 1 will be described below.

The high-frequency differential input signal voltage from the input terminals Vin1 and Vin2 is converted into differential current signals by the input-stage voltage-to-current converter 101. The differential current signals are input to the switching circuit 102. In the switching circuit 102, the differential current signals from the voltage-to-current converter 101 are switched over by the differential local signals input from the local terminals LOin1 and LOin2, and the differential output current signals the frequencies of which are converted into low frequencies are generated.

The differential output current signals from the switching circuit 102 are converted into differential output voltage signals by the load circuit 103 if a voltage input circuit such as the load circuit 103 is connected to the output terminals Out1 and Out2. The differential output voltage signals are thereby transmitted to the output terminals Out1 and Out2 as differential output signals that are voltage signals and input to a next-stage circuit from the output terminals Out1 and Out2. On the other hand, if a current input circuit such as a current-to-voltage converter is connected to the output terminals Out1 and Out2 as the next-stage circuit, the differential output current signals from the switching circuit 102 are input to the next-stage circuit at an impedance higher than an input impedance of the next-stage circuit from the output terminals Out1 and Out2. Needless to say, whether the load circuit 103 is the voltage input circuit or the current input circuit, the load circuit 103 functions to give an operating point of the next-stage circuit.

Not only a differential-mode signal originally desired but also a common-mode signal is included in the positive current signal and the reversed-phase current signal that are the differential current signals output from the input-stage voltage-to-current converter 101. This common-mode current component results from generation of a DC offset and an even-ordered distortion at the voltage-to-current converter 101 or the common-mode signal included in each of the differential input voltage signals from the input terminals Vin1 and Vin2.

As stated, the impedance element 104 is lower in impedance than the common-mode signal. Therefore, the common-mode signal is transmitted to the impedance element 104 in most parts and not input to the switching circuit 102. On the other hand, the impedance element 104 is higher in impedance than the differential-mode signal. Therefore, the differential-mode signal is almost entirely input to the switching circuit 102, so that frequency conversion is performed normally.

In this way, the mixer circuit shown in FIG. 1 can greatly suppress the deterioration in characteristics due to transmission of the common-mode signal generated by the input-stage voltage-to-current converter 101 to the switching circuit 102 and the subsequent-stage circuits.

Second Embodiment

Figure 2:
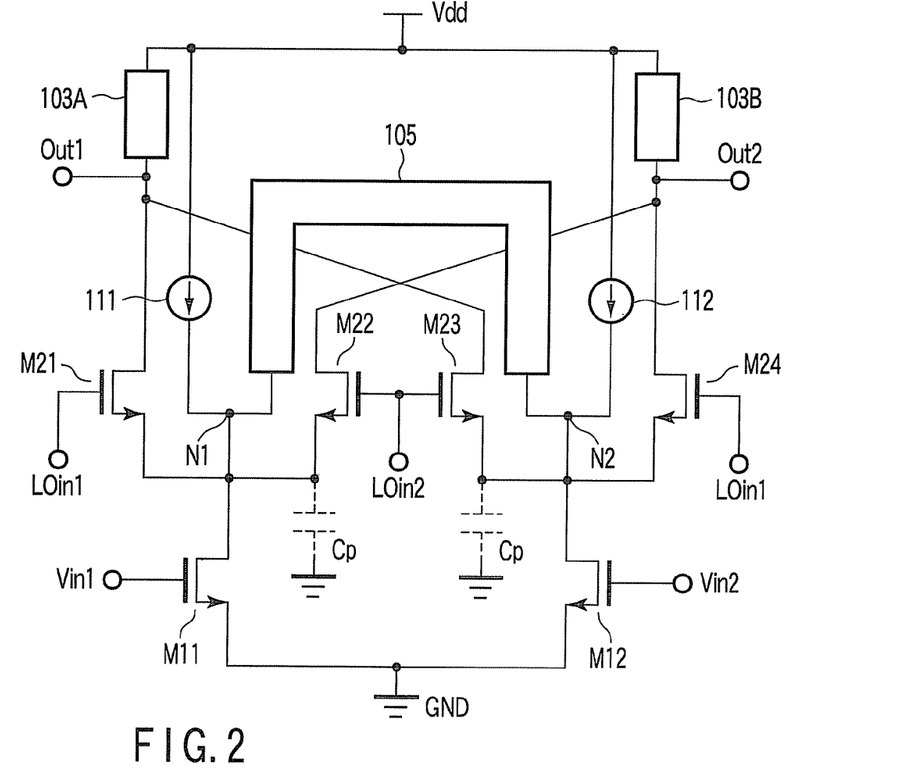
FIG. 2 is a circuit diagram showing a mixer circuit according to a second embodiment of the present invention.

A mixer circuit that is a more specific embodiment of the mixer circuit shown in FIG. 1 according to a second embodiment of the present invention will be described with reference to FIGS. 2, 3, and 4. FIG. 2 specifically shows the input-stage voltage-to-current converter 101, the load circuit 103, and the impedance circuit 104 in the mixer circuit.

The voltage-to-current converter 101 includes two MOS transistors M11 and M12. Gate terminals of the MOS transistors M11 and M12 are connected to the input terminals Vin1 and Vin2, respectively, a common source terminal to the MOS transistors M11 and M12 is connected to a ground GND, and drain terminals of the MOS transistors M11 and M12 are connected to the common terminals N1 and N2, respectively. The load circuit 103 includes two load elements 103A and 103B connected between the output terminals Out1 and Out2 and a power supply Vdd, respectively. The load elements 103A and 103B are, for example, passive resistance or active resistance which is composed from transistors.

The impedance element 104 includes a transmission line 105, which is connected between the common terminals N1 and N2 of the switching circuit 102. The transmission line 105 has a length of about a quarter of a wavelength (hereinafter, "used wavelength") at a used frequency of the mixer circuit, i.e., a frequency of differential input signal voltages input to the input terminals Vin1 and Vin2. Alternatively, the length of the transmission line 105 is set so as to have an inductance which causes a parallel resonance with a parasitic capacitance present on the common terminals N1 and N2 of the switching circuit 102 (parasitic capacitance present between the input-stage voltage-to-current converter 101 and the switching circuit 102) at the used frequency of the mixer circuit, i.e., the frequency of the differential input signal voltages input to the input terminals Vin1 and Vin2.

In the second embodiment, one end of each of current sources 111 and 112 is connected to each of the common terminals N1 and N2 of the switching circuit 102 while the other end of each of the current sources 111 and 112 is connected to the power supply Vdd or the other voltage source. The current sources 111 and 112 are realized by resistors or transistors. More specifically, a current of each of the current sources 111 and 112 is selected to be higher than 0 and equal to or lower than twice a current carried across transistors M21, M22, M23, and M24 of the switching circuit 102 in a state in which the current sources 111 and 112 are not connected to the switching circuit 102.

A basic operation performed by the mixer circuit shown in FIG. 2 is similar to that performed by the mixer circuit shown in FIG. 1. In the second embodiment, the transmission line 105 serving as the impedance element 104 has a relatively high impedance to the differential-mode signal between the positive phase current signal and the reversed phase current signal from the voltage-to-current converter 101, and has a relatively low impedance to the common-mode signal between the positive phase current signal and the reversed phase current signal based on the following principle.

As stated in the first embodiment, not only a differential-mode signal originally desired but also a common-mode signal is included in the common-mode current signal and the reversed-phase current signal that are the differential current signals output from the input-stage voltage-to-current converter 101. This common-mode signal results from generation of a DC offset and an even-ordered distortion at the voltage-to-circuit converter 101 or the common-mode signal included in each of the differential input voltage signals from the input terminals Vin1 and Vin2.

Figure 3:
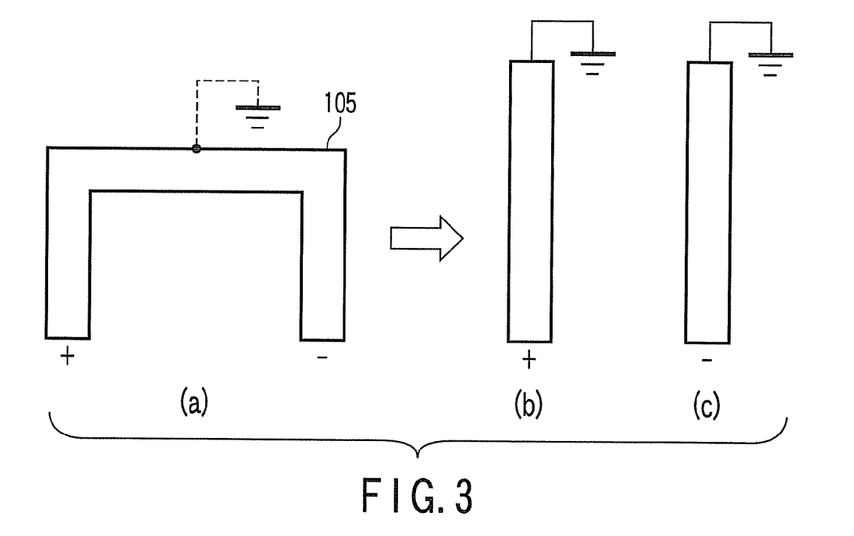
FIG. 3 is a pattern diagram showing operation with respect to differential-mode signals on a transmission line shown in FIG. 2.

At this time, as shown in FIG. 3A, the transmission line 105 virtually has a voltage of ground GND at a median with respect to the differential-mode signal. Therefore, as shown in FIGS. 3B and 3C, the transmission line 105 appears two short stubs. If a length of each short stub is a quarter of the signal wavelength, the short stub has quite a high impedance as is well known. Accordingly, the differential-mode signal does not diverge to the transmission line 105 but is input almost entirely to the switching circuit 102 and the parasitic capacitance Cp.

If a condition is set so that the transmission line 105 resonates with the parasitic capacitance Cp at the used frequency, a combined impedance of the parasitic capacitance Cp and the transmission line 105 is quite high as compared with the differential-mode signal. Accordingly, the differential-mode signal is transmitted almost entirely to the switching circuit 102. It is, therefore, possible to greatly improve gain deterioration resulting from divergence of the differential-mode signal to the parasitic capacitance Cp.

Figure 4:
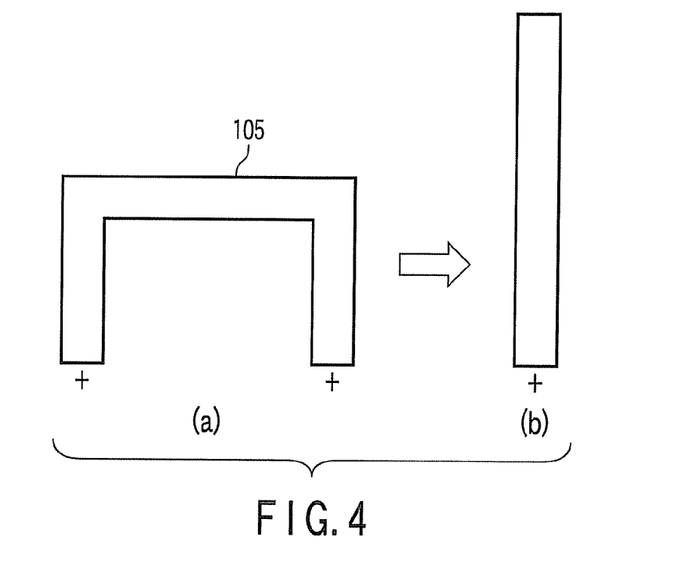
FIG. 4 is a pattern diagram showing operation with respect to common-mode signals on the transmission line shown in FIG. 2.

On the other hand, the transmission line 105 appears as shown in FIG. 4A with respect to the common-mode signal, that is, appears an open stub as shown in FIG. 4B. If a length of the open stub is a quarter of the signal wavelength, the impedance looks almost zero as is well known. Accordingly, the common-mode signal is transmitted to the ground GND via the transmission line 105 in most parts and does not diverge to the switching circuit 102 and the parasitic capacitance Cp.

If a condition is set so that the transmission line 105 resonates with the parasitic capacitance Cp at the used frequency, the transmission line 105 appears a large capacitance element to the common-mode signal. Therefore, most of the common-mode signal is transmitted to the transmission line 105 and the parasitic capacitance Cp and the common-mode signal diverging to the switching circuit 102 is greatly suppressed.

Moreover, according to the second embodiment, the current sources 111 and 112 are connected to the common terminals N1 and N2, respectively, whereby a DC current carried across the switching circuit 102 is reduced as compared with the instance of lack of the current sources 111 and 112. Therefore, the noise generated in the switching circuit 102 and voltage drops caused by the load elements 103A and 103B are reduced. Besides, even if the amplitude of the local signal input to the switching circuit 102 is low, the switching circuit 102 can perform switching operation. In this way, the mixer circuit that can operate even in the environment of low noise and low power supply voltage and that can operate even if the local signal has low amplitude can be realized.

As stated so far, according to the second embodiment, the mixer circuit can greatly suppress the deterioration in characteristics due to the transmission of the common-mode signal generated by the input-stage voltage-to-current converter 101 to the switching circuit 102 and the subsequent-stage circuits, operate at low noise and low power supply voltage, and operate even if the amplitude of the local signal is low.

Third Embodiment

Figure 5:
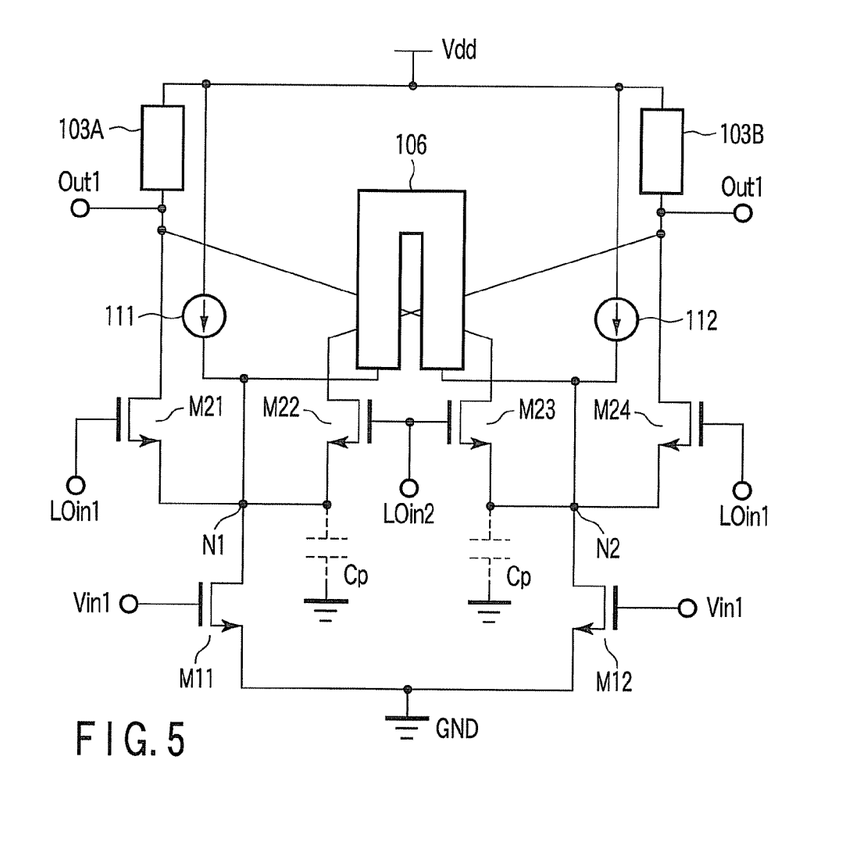
FIG. 5 is a circuit diagram showing a mixer circuit according to a third embodiment of the present invention.

FIG. 5 shows a mixer circuit according to a third embodiment of the present invention. A differential transmission line 106 is used as the impedance element 104 shown in FIG. 1. In other words, the single-phase transmission line 105 shown in FIG. 2 is replaced by the differential transmission line 106. The differential transmission line 106 is a U shaped line similarly to the transmission line 105 shown in FIG. 2. However, unlike the transmission line 105, a distance between opposing lines is small and a characteristic impedance for the common-mode signal differs from that for the differential-mode signal due to coupling of the opposing lines.

The mixer circuit according to the third embodiment is similar to that according to the second embodiment except that the differential transmission line 106 has different characteristic impedances with respect to the common-mode signal and the differential-mode signal. Therefore, the mixer circuit according to the third embodiment will not be further described in detail.

Fourth Embodiment

Figure 6:
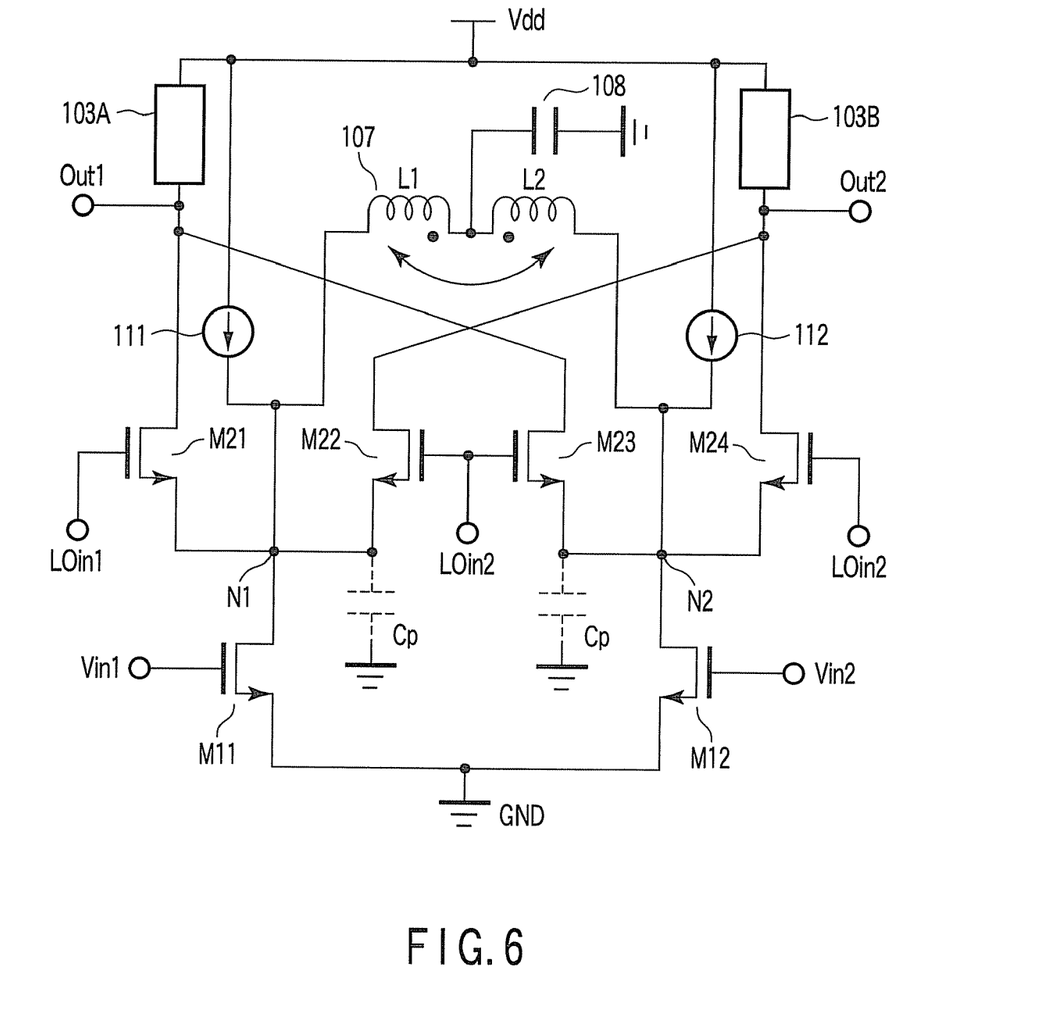
FIG. 6 is a circuit diagram showing a mixer circuit according to a fourth embodiment of the present invention.

FIG. 6 shows a mixer circuit according to a fourth embodiment of the present invention. A differential inductor 107 is used as the impedance element 104 shown in FIG. 1. In other words, the single-phase transmission line 105 shown in FIG. 2 is replaced by the differential inductor 107. The differential inductor 107 includes a median terminal and coils L1 and L2 in opposite directions are arranged on both sides of the median terminal, respectively. Furthermore, a bypass capacitor 108 is connected between the median terminal of the differential inductor 107 and a constant potential point (corresponding to the ground GND in the fourth embodiment).

The differential inductor 107 has a sufficiently higher impedance than those of the switching circuit 102 and the parasitic capacitance Cp on the common terminals N1 and N2 at the used frequency. Alternatively, the differential inductor 107 has such an inductance as to obtain differential impedances that cause a parallel resonance with the parasitic capacitance Cp.

A basic operation performed by the mixer circuit shown in FIG. 6 is similar to that performed by the mixer circuit shown in FIG. 1. In the fourth embodiment, the differential inductor 107 serving as the impedance element 104 has a relatively high impedance to the differential-mode signal between the positive phase current signal and the reversed phase current signal from the voltage-to-current converter 101, and has a relatively low impedance to the common-mode signal between the positive phase current signal and the reversed phase current signal based on the following principle.

As stated, not only a differential-mode signal originally desired but also a common-mode signal is included in the common-mode current signal and the reversed-phase current signal that are the differential current signals output from the input-stage voltage-to-current converter 101. This common-mode signal results from generation of a DC offset and an even-ordered distortion at the voltage-to-current converter 101 or the common-mode signal included in each of the differential input voltage signals from the input terminals Vin1 and Vin2.

At this time, since the inductance of the differential inductor 107 appears quite high to the differential-mode signal, the impedance of the differential inductor 107 becomes quite high, and the differential-mode signal is transmitted almost entirely to the switching circuit 102 and the parasitic capacitance Cp.

If a condition is set so that the inductance of the differential inductor 107 resonates with the parasitic capacitance Cp, a combined impedance of the parasitic capacitance Cp and the differential inductor 107 is quite high. Accordingly, the differential-mode signal is transmitted almost entirely to the switching circuit 102. This effect makes it possible to greatly improve gain deterioration resulting from divergence of the differential-mode signal to the parasitic capacitance Cp.

On the other hand, the differential inductor 107 appears quite a low inductance to the common-mode signal. Accordingly, the common-mode signal diverges almost entirely to the ground GND via the differential inductor 107 and the bypass capacitor 108 and is not transmitted to the switching circuit 102.

If a condition is set so that the differential inductor 107 resonates with the parasitic capacitance Cp at the used frequency, the resonance frequency of the differential inductor 107 is quite high for the common-mode signal. Therefore, most of the common-mode signal is transmitted to the ground GND via the differential inductor 107 and the parasitic capacitance Cp, and the common-mode signal diverging to the switching circuit 102 is greatly suppressed.

Moreover, according to the fourth embodiment, the current sources 111 and 112 are connected to the common terminals N1 and N2, respectively, whereby a DC current carried across the switching circuit 102 is reduced as compared with the instance of lack of the current sources 111 and 112. Therefore, the noise generated in the switching circuit 102 and voltage drops caused by the load elements 103A and 103B are reduced. Besides, even if the amplitude of the local signal input to the switching circuit 102 is low, the switching circuit 102 can perform switching operation. In this way, the mixer circuit that can operate even in the environment of low noise and low power supply voltage and that can operate even if the local signal has low amplitude can be realized.

As stated so far, according to the fourth embodiment, the mixer circuit can greatly suppress deteriorations in characteristics due to transmission of the common-mode signal generated by the input-stage voltage-to-current converter 101 to the switching circuit 102 and the subsequent-stage circuits, operate at low noise and low power supply voltage, and operate even if the amplitude of the local signal is low.

Figure 7:
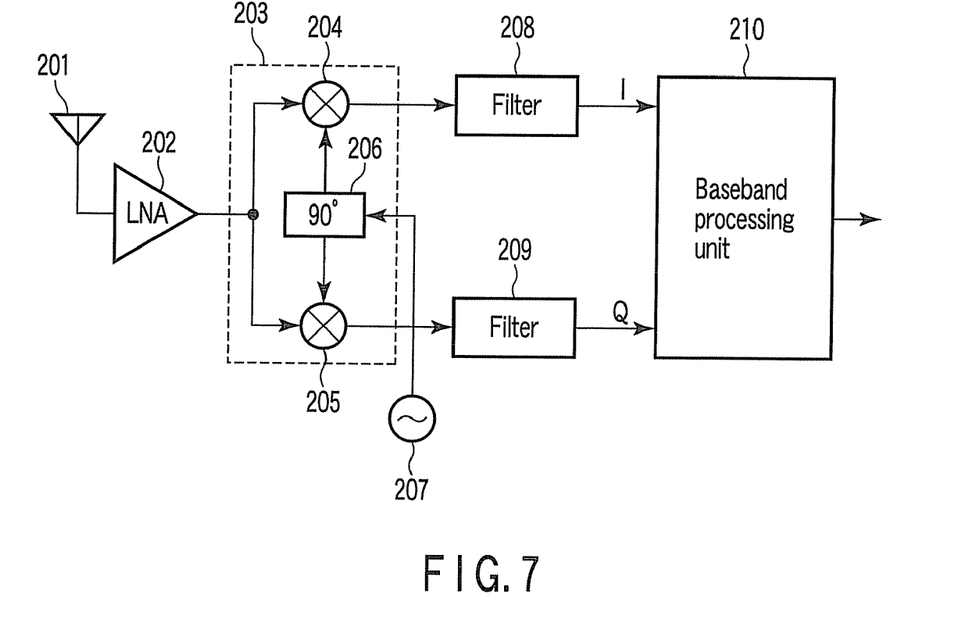
FIG. 7 is a block diagram showing a receiver according to a fifth embodiment of the present invention.
Figure 8:
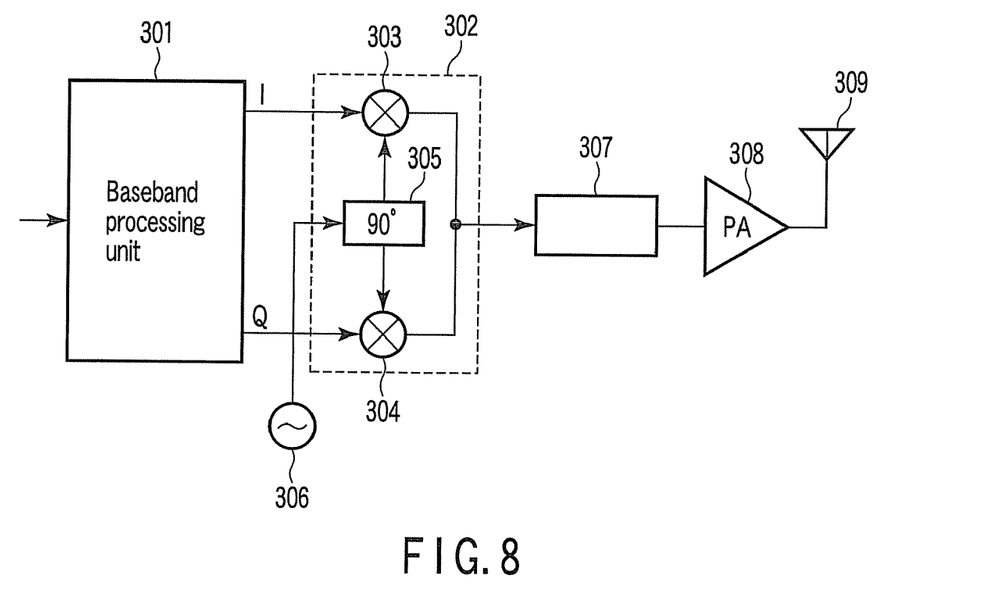
FIG. 8 is a block diagram showing a transmitter according to a sixth embodiment of the present invention.

Each of the mixer circuits according to the first to fourth embodiments is applicable to an analog front-end system of a radio communication device which processes high-frequency signals such as microwave signals or millimeter wave signals. In that case, the deterioration in characteristics due to manufacturing irregularity and input of high current signals can be greatly suppressed. FIGS. 7 and 8 show a receiver and a transmitter as examples of such a radio communication device, respectively.

Fifth Embodiment

In the receiver shown in FIG. 7, an RF signal received by an antenna 201 is amplified by a low noise amplifier (LNA) 202, and the amplified RF signal is input to a quadrature demodulator 203. The quadrature demodulator 203 generates two received baseband signals (I signal and Q signal) orthogonal to each other. The received baseband signals are passed through filters 208 and 209, respectively, and processed by a baseband processing unit 210 including an analog-to-digital converter (ADC) and a digital signal processor (DSP), thereby decoding and reproducing an original data signal.

The quadrature demodulator 203 includes mixer circuits 204 and 205 and a 90-degree phase shifter 206. An original local signal from a local oscillator 207 is input to the 90-degree phase shifter 206 and two local signals orthogonal to each other are generated. These orthogonal local signals are input to local terminals of the mixer circuits 204 and 205, respectively. The received RF signal is input to a common input terminal of the mixer circuits 204 and 205. Accordingly, the two received baseband signals orthogonal to each other are generated and output from output terminals of the mixer circuits 204 and 205, respectively.

Sixth Embodiment

In the transmitter shown in FIG. 8, a baseband signal processing unit 301 generates transmitted baseband signals (I signal and Q signal) according to a to-be-transmitted data signal. The transmitted baseband signals are subjected to quadrature modulation by a quadrature modulator 302, thereby generating a transmitted RF signal. The transmitted RF signal is passed through a filter 307 and amplified by a power amplifier (PA) 308, after which the resultant transmitted RF signal is transmitted from an antenna 309.

The quadrature modulator 302 includes mixer circuits 303 and 304 and a 90-degree phase shifter 305. An original local signal from a local oscillator 306 is input to the 90-degree phase shifter 305 and two local signals orthogonal to each other are generated. These orthogonal local signals are input to local terminals of the mixer circuits 303 and 304, respectively. Transmitted baseband signals (I signal and Q signal) are input to input terminals of the mixer circuits 303 and 304, respectively. The signals output from the mixer circuits 303 and 304 are combined, thereby generating the transmitted RF signal.

The radio communication device stated above can employ the mixer circuit described in each of the first to fourth embodiments as each of the mixer circuits 204 and 205 shown in FIG. 7 or each of the mixer circuits 304 and 305 shown in FIG. 8. Further, the mixer circuit described in each of the first to fourth embodiments can be used as a down converter employed in the receiver or an up converter employed in the transmitter.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A mixer circuit comprising:
   a voltage-to-current converter which converts a positive phase input voltage signal and a reversed phase input voltage signal input to a first input terminal and a second input terminal into a positive phase current signal and a reversed phase current signal, respectively;
   a switching circuit which includes a first common terminal and a second common terminal receiving the positive phase current signal and the reversed phase current signal and a first local terminal and a second local terminal receiving a positive phase local signal and a reversed phase local signal, respectively, switches over the positive phase current signal and the reversed phase current signal according to the positive phase local signal and the reversed phase local signal, and generates a positive phase output current signal and a reversed phase output current signal; and an impedance element connected between the first common terminal and the second common terminal, having a relatively high impedance to a differential-mode signal between the positive phase current signal and the reversed phase current signal, and having a relatively low impedance to a common-mode signal between the positive phase current signal and the reversed phase current signal.

2. The mixer circuit according to claim 1, wherein the impedance element includes a transmission line at a length about a quarter of a wavelength of the positive phase input voltage signal and the reversed phase input voltage signal.

3. The mixer circuit according to claim 1, wherein the impedance element includes a transmission line having an inductance resonating with a parasitic capacitance present on the first common terminal and the second common terminal at a frequency of the positive phase input voltage signal and the reversed phase input voltage signal.

4. The mixer circuit according to claim 1, wherein the impedance element includes a transmission line having a different characteristic impedance from impedances of the differential-mode signal and the common-mode signal.

5. The mixer circuit according to claim 1, wherein the impedance element includes a differential inductor having a median terminal and a capacitor connected between the median terminal and a constant potential point.

6. The mixer circuit according to claim 5, wherein the differential inductor has a sufficiently high impedance as compared with an impedance of the switching circuit at a frequency of the positive phase input voltage signal and the reversed phase input voltage signal.

7. The mixer circuit according to claim 5, wherein the differential inductor has an inductance resonating with a parasitic capacitance present on the first common terminal and the second common terminal at a frequency of the positive phase input voltage signal and the reversed phase input voltage signal.

8. The mixer circuit according to claim 1, further comprising:
a load circuit which subjects the positive phase output current signal and the reversed phase output current signal to current-to-voltage conversion, and transmits a positive phase output voltage signal and a reversed phase output voltage signal to a next-stage circuit.

9. The mixer circuit according to claim 1, further comprising:
a load circuit which transmits the positive phase output current signal and the reversed phase output current signal to a next-stage circuit at a higher impedance than an input impedance of the next-stage circuit.

10. A radio communication device comprising at least one of a frequency converter, a quadrature modulator, and a quadrature demodulator each employing the mixer circuit according to claim 1.

11. A mixer circuit comprising:
a voltage-to-current converter which converts a positive phase input voltage signal and a reversed phase input voltage signal input to a first input terminal and a second input terminal into a positive phase current signal and a reversed phase current signal, respectively;
a switching circuit which includes a first common terminal and a second common terminal receiving the positive phase current signal and the reversed phase current signal and a first local terminal and a second local terminal receiving a positive phase local signal and a reversed phase local signal, respectively, switches over the positive phase current signal and the reversed phase current signal according to the positive phase local signal and the reversed phase local signal, and generates a positive phase output current signal and a reversed phase output current signal;
an impedance element connected between the first common terminal and the second common terminal, having a relatively high impedance to a differential-mode signal between the positive phase current signal and the reversed phase current signal, and having a relatively low impedance to a common-mode signal between the positive phase current signal and the reversed phase current signal; and
a first current source and a second current source connected to the first common terminal and the second common terminal, respectively.

12. The mixer circuit according to claim 11, wherein the impedance element includes a transmission line at a length about a quarter of a wavelength of the positive phase input voltage signal and the reversed phase input voltage signal.

13. The mixer circuit according to claim 11, wherein the impedance element includes a transmission line having an inductance resonating with a parasitic capacitance present on the first common terminal and the second common terminal at a frequency of the positive phase input voltage signal and the reversed phase input voltage signal.

14. The mixer circuit according to claim 11, wherein the impedance element includes a transmission line having a different characteristic impedance from impedances of the differential-mode signal and the common-mode signal.

15. The mixer circuit according to claim 11, wherein the impedance element includes a differential inductor having a median terminal and a capacitor connected between the median terminal and a constant potential point.

16. The mixer circuit according to claim 15, wherein the differential inductor has a sufficiently high impedance as compared with an impedance of the switching circuit at a frequency of the positive phase input voltage signal and the reversed phase input voltage signal.

17. The mixer circuit according to claim 15, wherein the differential inductor has an inductance resonating with a parasitic capacitance present on the first common terminal and the second common terminal at a frequency of the positive phase input voltage signal and the reversed phase input voltage signal.

18. The mixer circuit according to claim 11, further comprising:
a load circuit which subjects the positive phase output current signal and the reversed phase output current signal to current-to-voltage conversion, and transmits a positive phase output voltage signal and a reversed phase output voltage signal to a next-stage circuit.

19. The mixer circuit according to claim 11, further comprising:
a load circuit which transmits the positive phase output current signal and the reversed phase output current signal to a next-stage circuit at a higher impedance than an input impedance of the next-stage circuit.

20. A radio communication device comprising at least one of a frequency converter, a quadrature modulator, and a quadrature demodulator each employing the mixer circuit according to claim 11.

* * * * *